(12) United States Patent
Tian

(10) Patent No.: US 11,614,484 B2
(45) Date of Patent: Mar. 28, 2023

(54) METHOD AND SYSTEM FOR TESTING TIME PARAMETERS OF ADAPTOR

(71) Applicant: GUANGDONG OPPO MOBILE TELECOMMUNICATIONS CORP., LTD., Guangdong (CN)

(72) Inventor: Chen Tian, Guangdong (CN)

(73) Assignee: GUANGDONG OPPO MOBILE TELECOMMUNICATIONS CORP., LTD., Dongguan (CN)

(*) Notice: Subject to any disclaimer, the term of this patent is extended or adjusted under 35 U.S.C. 154(b) by 183 days.

(21) Appl. No.: 16/730,615

(22) Filed: Dec. 30, 2019

(65) Prior Publication Data
US 2020/0132755 A1   Apr. 30, 2020

Related U.S. Application Data

(63) Continuation of application No. PCT/CN2018/109218, filed on Sep. 30, 2018.

(51) Int. Cl.
*G01R 31/28* (2006.01)
(52) U.S. Cl.
CPC ............................... *G01R 31/2882* (2013.01)
(58) Field of Classification Search
CPC ............. G01R 31/2882; G01R 19/0092; G01R 29/50; G01R 19/16595; G01R 31/40; H02J 7/0047; H02J 7/00036
USPC ............................................................ 702/79
See application file for complete search history.

(56) References Cited

U.S. PATENT DOCUMENTS

| 6,356,514 B1* | 3/2002 | Wells ..................... G01R 27/04 368/118 |
| 2013/0275811 A1 | 10/2013 | Wong et al. |
| 2017/0194798 A1 | 7/2017 | Tian et al. |

(Continued)

FOREIGN PATENT DOCUMENTS

| CN | 201348647 | * | 11/2008 |
| CN | 102439465 | * | 5/2012 |
| CN | 102439465 A | | 5/2012 |

(Continued)

OTHER PUBLICATIONS

English translation for CN201348647, Nov. 18, 2013. (Year: 2013).*

(Continued)

*Primary Examiner* — Michael P Nghiem
(74) *Attorney, Agent, or Firm* — Young Basile Hanlon & MacFarlane, P.C.

(57) ABSTRACT

Provided are methods and systems for testing time parameters of an adaptor and systems. The method includes the following. After a testing system is coupled with an adaptor, a clock signal is received from the adaptor, where the clock signal is indicative of the transmission time of the instruction. A first valid interrupt of the clock signal, a square wave corresponding to the first valid interrupt, and a next valid interrupt of the first valid interrupt are acquired. A first falling edge and a first rising edge of the first valid interrupt, a second falling edge of the square wave, and a third falling edge of the next valid interrupt are acquired. A test result time parameters of the adaptor is generated according to the first falling edge, the first rising edge, the second falling edge, and the third falling edge.

15 Claims, 4 Drawing Sheets

(56) References Cited

U.S. PATENT DOCUMENTS

2017/0194799 A1* 7/2017 Tian ................. H02J 7/0071

FOREIGN PATENT DOCUMENTS

| CN | 102810003 | A | | 12/2012 |
|---|---|---|---|---|
| CN | 105511581 | A | | 4/2016 |
| CN | 106063073 | A | | 10/2016 |
| CN | 106068596 | A | | 11/2016 |
| CN | 106537723 | A | | 3/2017 |
| CN | 107210615 | A | | 9/2017 |
| CN | 107508355 | A | | 12/2017 |
| CN | 108521417 | A | | 9/2018 |
| DE | 19939579 | A1 | | 5/2000 |
| JP | H02195448 | A | | 8/1990 |
| JP | 2006252015 | A | | 9/2006 |
| JP | 2014050232 | A | | 3/2014 |
| JP | 2017522844 | A | * | 8/2017 |
| JP | 2017522844 | A | | 8/2017 |
| WO | 2012119401 | A1 | | 9/2012 |
| WO | 2013158788 | A2 | | 10/2013 |

OTHER PUBLICATIONS

English Abstract of CN 201348647, May 2012. (Year: 2012).*
English Abstract of CN 102439465, Nov. 2009. (Year: 2009).*
English translation of JP 2017-522844, Aug. 2017. (Year: 2017).*
India First Examination Report for IN Application 201917054609 dated Jan. 29, 2021. (5 pages).
International Search Report with English translation for Application PCT/CN2018/109218 dated May 29, 2019 (14 pages).
Extended European Search Report for EP Application 18934529.1 dated Feb. 17, 2021. (9 pages).
Chinese First Office Action with English Translation for CN Application 201880033229.1 dated Oct. 28, 2021. (23 pages).
Japanese Office Action with English Translation for JP Application 2021506302 dated Apr. 15, 2022. (10 pages).

* cited by examiner

METHOD AND SYSTEM FOR TESTING TIME PARAMETERS OF ADAPTOR

CROSS-REFERENCE TO RELATED APPLICATION(S)

This application is a continuation of International Application No. PCT/CN2018/109218, filed on Sep. 30, 2018, the disclosure of which is hereby incorporated by reference in its entirety.

TECHNICAL FIELD

This disclosure relates to the field of charging technology of terminals, and more particularly to a method and system for testing time parameters of an adaptor.

BACKGROUND

With quick charging technology, a battery of a terminal can be charged with an adaptor in a multi-stage constant-current manner. As such, quick charging can be performed while ensuring safety and reliability, which improves greatly charging speed of the terminal. During quick charging, the adaptor performs a two-way communication with the terminal, and therefore the time at which the adaptor sends an instruction has some influence on flash charging.

In the related art, the time at which the adaptor sends an instruction is detected with an oscilloscope. In such detecting process, a large quantity of detecting instructions are required and the detecting process is complicated, which results in low detecting efficiency and poor detecting accuracy.

SUMMARY

A method for testing time parameters of an adaptor is provided. The method includes the following. After a testing system is coupled with an adaptor, a clock signal is received from the adaptor, where the clock signal is indicative of the transmission time of the instruction. A first valid interrupt of the clock signal, a square wave corresponding to the first valid interrupt, and a next valid interrupt of the first valid interrupt are acquired. A first falling edge and a first rising edge of the first valid interrupt, a second falling edge of the square wave, and a third falling edge of the next valid interrupt are acquired. A test result of time parameters of the adaptor is generated according to the first falling edge, the first rising edge, the second falling edge, and the third falling edge.

A system for testing time parameters of an adaptor is provided. The testing system includes a receiving section, an acquiring section, and a generating section. The receiving section is configured to receive a clock signal from the adaptor after the testing system is coupled with the adaptor, where the clock signal is indicative of a transmission time of an instruction. The acquiring section configured to: acquire a first valid interrupt of the clock signal, a square wave corresponding to the first valid interrupt, and a next valid interrupt of the first valid interrupt; acquire a first falling edge and a first rising edge of the first valid interrupt, a second falling edge of the square wave, and a third falling edge of the next valid interrupt. The generating section is configured to generate a test result of time parameters of the adaptor according to the first falling edge, the first rising edge, the second falling edge, and the third falling edge.

DETAILED DESCRIPTION

Figure 1:
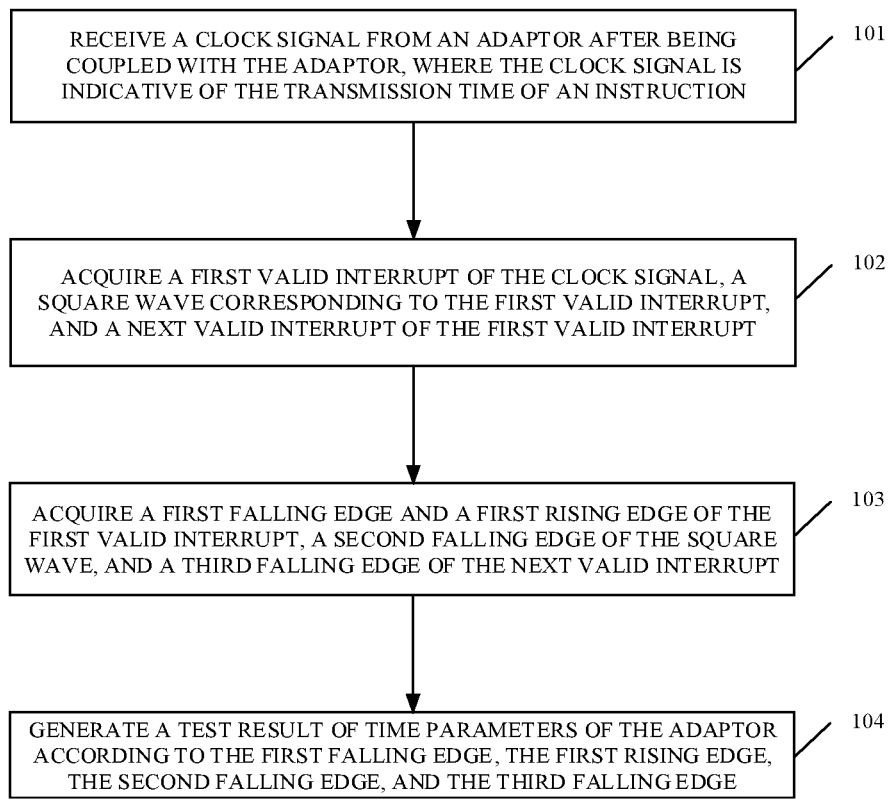
FIG. 1 is a schematic flowchart of a method for testing the time of an instruction according to implementations.

Technical solutions of implementations will be described clearly and completely in connection with the accompanying drawings. It can be understood that, implementations described herein are merely for explaining rather than limiting the present disclosure. In addition, for the convenience of description, only parts related to the implementations are illustrated in the accompanying drawings.

In quick charging of a terminal, a specialized adaptor and a specialized battery are needed to achieve flash charging. In general, an adaptor intended for flash charging is provided with a microcontroller unit (MCU) smart chip, and therefore the adaptor is an upgradable smart charger.

In addition, according to implementations, quick charging of the terminal by the adaptor mainly includes the following five stages.

Stage 1: the terminal detects the type of the adaptor. The adaptor initiates handshake communication between the adaptor and the terminal. The adaptor sends a first instruction to the terminal to inquire whether to enable a quick charging mode. When the terminal agrees to enable the quick charging mode, the communication process for quick charging proceeds to stage 2.

Stage 2: the adaptor sends to the terminal a second instruction to inquire whether an output voltage of the adaptor is suitable. When the terminal replies to the adaptor that the output voltage of the adaptor is high, low, or suitable, the adaptor adjusts the output voltage until the output voltage is suitable.

Stage 3: the adaptor sends to the terminal a third instruction to inquire a maximum charging current that the terminal can currently support. The terminal replies to the adaptor the maximum charging current, and the communication process proceeds to stage 4.

Stage 4: the adaptor sets an output current thereof to be the maximum charging current that the terminal can currently support, and the communication process proceeds to a constant-current stage, that is, stage 5.

Stage 5: in the constant-current stage, the adaptor sends, at a certain time interval, a fourth instruction to inquire a present voltage of a battery of the terminal. The terminal feeds back the present voltage of the battery to the adaptor.

The adaptor determines, according to the present voltage of the battery fed back by the terminal, whether the terminal is in a good contact and whether it is necessary to decrease a present charging current applied to the terminal.

It is to be noted that, the constant-current stage however does not mean that the output current of the adaptor remains unchanged in stage 5. The "constant-current" refers to multi-stage constant current, that is, the output current remains unchanged in a certain time period.

Since quick charging is achieved by establishing a two-way communication between the adaptor and the terminal for multi-stage constant-current charging of the terminal, parameters related to an instruction(s) sent by the adaptor has a great influence on flash charging. Therefore, it is of vital importance to detect parameters related to the instruction sent by the adaptor.

Hereinafter, technical solutions of implementations will be described clearly and completely with reference to the accompanying drawings.

A method for testing the time of an instruction is provided. FIG. 1 is a schematic flowchart of a method for testing the time of an instruction according to implementations. As illustrated in FIG. 1, a testing system performs the method as follows.

At block 101, after being coupled with an adaptor, the testing system receives a clock signal from the adaptor, where the clock signal is indicative of the transmission time of the instruction.

According to implementations, the testing system receives the clock signal from the adaptor after being coupled with the adaptor.

It is to be noted that, according to implementations, during transmission of an instruction between the adaptor and the testing system, the clock signal can be used to control the transmission time of the instruction. The adaptor sends the clock signal to the testing system, such that a two-way communication is performed between the adaptor and the testing system according to a clock cycle of the clock signal.

Figure 2:
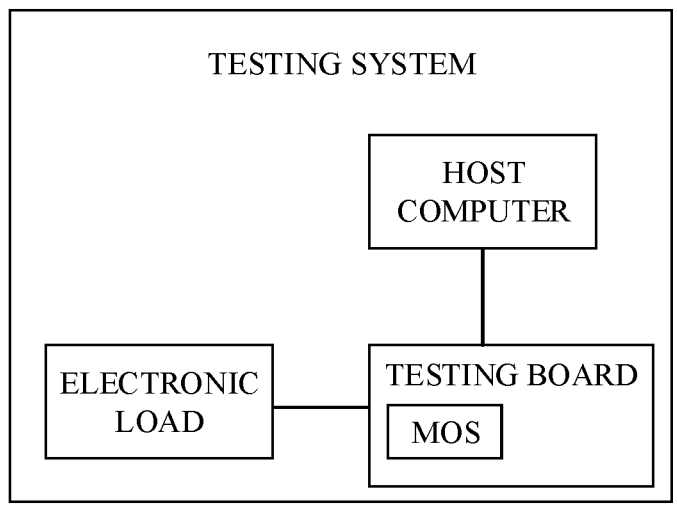
FIG. 2 is a schematic diagram of a testing system according to implementations.

It is to be noted that, according to implementations, the testing system can be a system for detecting parameters of the adaptor. FIG. 2 is a schematic diagram of a testing system according to implementations. As illustrated in FIG. 2, the testing system includes a testing board, an electronic load, and a host computer. The testing board is coupled with and cooperates with the electronic load to simulate a state of the terminal by controlling a metal-oxide-semiconductor field-effect transistor (MOSFET) switch. Specifically, according to implementations, the testing board can transmit various data or value of the adaptor detected to the host computer, for example, the testing board reports an output state detected of the adaptor to the host computer.

Figure 3:
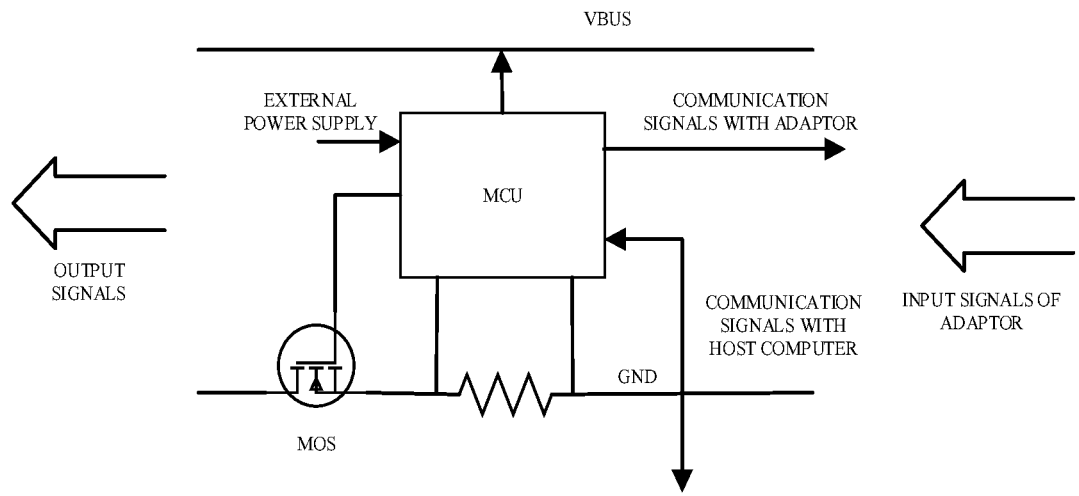
FIG. 3 is a schematic diagram of a testing board according to implementations.

FIG. 3 is a schematic diagram of a testing board according to implementations. As illustrated in FIG. 3, the testing board is integrated with an MCU and a MOS. VBUS represents USB voltage, and GND represents power ground.

Figure 4:
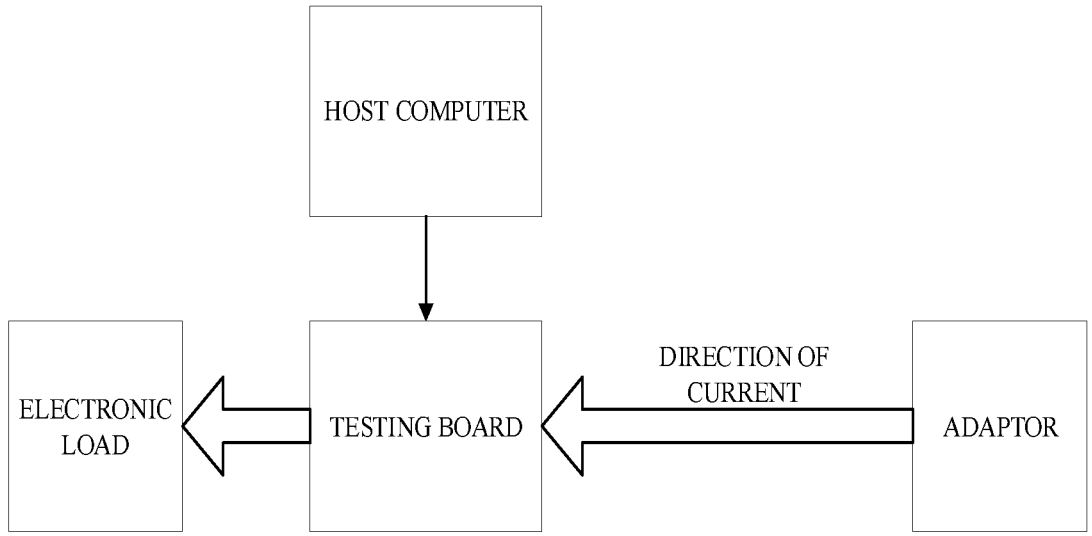
FIG. 4 is a schematic diagram illustrating connection between a testing system and an adaptor according to implementations.

In addition, FIG. 4 is a schematic diagram illustrating connection between a testing system and an adaptor according to implementations. As illustrated in FIG. 4, the testing board of the testing system is configured to be coupled with the adaptor and to perform a two-way communication with the adaptor.

According to implementations, through coupling and communication with the adaptor, the testing system can simulate quick charging of the terminal performed by the adaptor, such that various parameters of the adaptor can be directly tested without acquiring via an oscilloscope a test result of the parameters of the adaptor.

In addition, according to implementations, when the testing system is coupled with and communicates with the adaptor to simulate quick charging of the terminal performed by the adaptor, a first interrupt of the clock signal received by the testing system can be a first byte during quick charging of the terminal performed by the adaptor, that is, a first byte of the first instruction for inquiring whether to enable the quick charging mode in stage 1 described above.

It is to be noted that, according to implementations, the first interrupt of the clock signal may also be a testing byte sent by the adaptor for parameter detection of the adaptor.

In addition, according to implementations, the adaptor is configured to perform quick charging on the terminal. Specifically, the adaptor can be coupled with the terminal through a universal serial bus (USB) interface. The USB interface may be a normal USB interface, a micro USB interface, a Type C interface, or the like. The USB interface has a power line through which the adaptor charges the terminal. The power line of the USB interface may be a VBUS line and/or a ground line of the USB interface. The USB interface has a data line through which the power adaptor can perform two-way communication with the terminal. The data line may be a D+ line and/or a D− line of the USB interface. The "two-way communication" can refer to information interchange between the adaptor and the terminal.

In addition, according to implementations, the adaptor is operable in a normal charging mode or a quick charging mode. A charging current in the quick charging mode is larger than that in the normal charging mode, that is, a charging speed in the quick charging mode is higher than that in the normal charging mode. In general, the normal charging mode can be comprehended as a charging mode in which a rated output voltage is 5V (volt) and a rated output current is smaller than or equal to 2.5 A (ampere). In addition, in the normal charging mode, output ports D+ and D− of the adaptor can be short-circuited. However, in the quick charging mode, the adaptor can communicate and exchange data with the terminal through D+ and D−.

It is to be noted that, according to implementations, since the adaptor is a decisive factor in quick charging of the terminal, it is of great importance to test performance parameters of the adaptor. The performance parameters of the adaptor can include time parameters regarding sending instructions, an output voltage, an output current, etc.

It is to be noted that, according to implementations, after the testing system is coupled with the adaptor, the adaptor can send the clock signal to the testing system through the data line of the USB interface. The clock signal is indicative of communication timing between the adaptor and the testing system. Specifically, the adaptor sends initiatively the clock signal to the testing system and sending of the clock signal can last while the adaptor is coupled with the testing system, such that the adaptor can perform two-way communication with the testing system under control of the communication timing.

In addition, according to implementations, the communication timing includes a time period for sending instructions by the adaptor and a time period for receiving instructions from the adaptor, where the time period for sending and the time period for receiving occur alternately.

In addition, according to implementations, when the testing system is coupled with the adaptor, the testing system receives the clock signal from the adaptor through the D+ data line.

Figure 5:
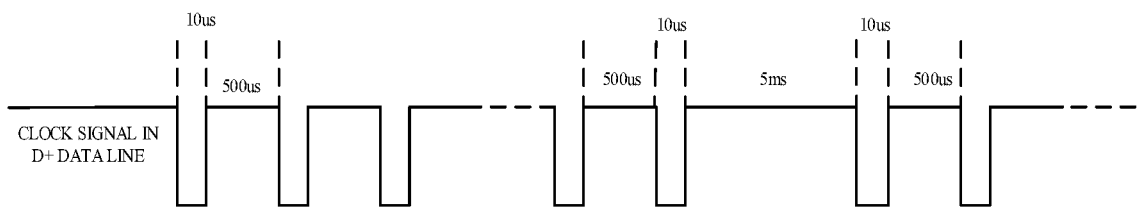
FIG. 5 is a schematic diagram of a clock signal according to implementations.

FIG. 5 is a schematic diagram of a clock signal according to implementations. As illustrated in FIG. 5, the clock signal in the D+ data line has low level and high level. One clock cycle includes low level and high level, for example, one clock cycle includes low level for 10 μs (microsecond) and high level for 500 μs.

Figure 6:
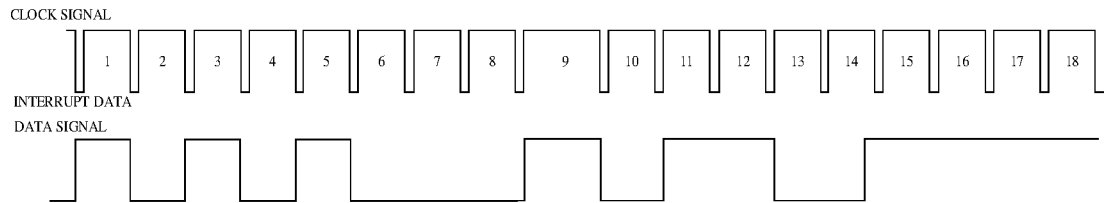
FIG. 6 is a schematic diagram of a clock signal and a data signal used for transmitting an instruction according to implementations.

FIG. 6 is a schematic diagram of a clock signal and a data signal used for transmitting an instruction according to implementations. As illustrated in FIG. 6, each instruction sent to the terminal by the adaptor includes data of 8 bits. The adaptor sends eight bits of data to the terminal according to eight consecutive clock cycles of the clock signal, where in each of the eight consecutive clock cycles, the first 10 μs are interrupts and the remaining 500 μs are data. On the other hand, each reply instruction received from the terminal by the adaptor includes ten bits of data. The adaptor receives from the terminal ten bits of data according to ten consecutive clock cycles of the clock signal, where in each of the ten consecutive clock cycles, the first 500 μs are data and the remaining 10 μs are interrupts.

In addition, according to implementations, after being coupled with the adaptor, the testing system can test the time of the instruction according to the clock signal received.

At block 102, the testing system acquires a first valid interrupt of the clock signal, a square wave corresponding to the first valid interrupt, and a next valid interrupt of the first valid interrupt.

According to implementations, after receiving the clock signal from the adaptor, the testing system determines the first valid interrupt of the clock signal, the square wave corresponding to the first valid interrupt, and the next valid interrupt of the first valid interrupt.

In addition, according to implementations, after receiving the clock signal, the testing system can collect valid interrupts and square waves of the clock signal to acquire the first valid interrupt, a first square wave, and a second valid interrupt of the clock signal, that is, to acquire the first valid interrupt, the square wave corresponding to the first valid interrupt, and the next valid interrupt of the first valid interrupt.

It is to be noted that, according to implementations, since the first instruction sent by the adaptor in stage 1 described above is for determining whether to enable quick charging, when testing the time of the instruction, the testing system needs to test timing of the first instruction sent by the adaptor. Therefore, it is necessary to acquire the first valid interrupt and the square wave corresponding to the first valid interrupt.

It is to be noted that, according to implementations, when testing the time of the instruction, the testing system can determine, according to two consecutive valid interrupts, a data transmission interval and a data transmission duration, and therefore it is necessary to collect the next valid interrupt of the first valid interrupt.

At block 103, the testing system acquires a first falling edge and a first rising edge of the first valid interrupt, a second falling edge of the square wave, and a third falling edge of the next valid interrupt.

According to implementations, after acquiring the first valid interrupt, the square wave, and the next valid interrupt, the testing system can acquire the first falling edge and the first rising edge of the first valid interrupt, the second falling edge of the square wave, and the third falling edge of the next valid interrupt.

It is to be noted that, according to implementations, the testing system can further determine, according to the first valid interrupt, the square wave, and the next valid interrupt, whether the adaptor satisfies instruction timing requirements. The testing system first detects rising edges and falling edges of the first valid interrupt, the square wave, and the next valid interrupt, to acquire the first falling edge and the first rising edge of the first valid interrupt, the second falling edge of the square wave, and the third falling edge of the next valid interrupt.

Figure 7:
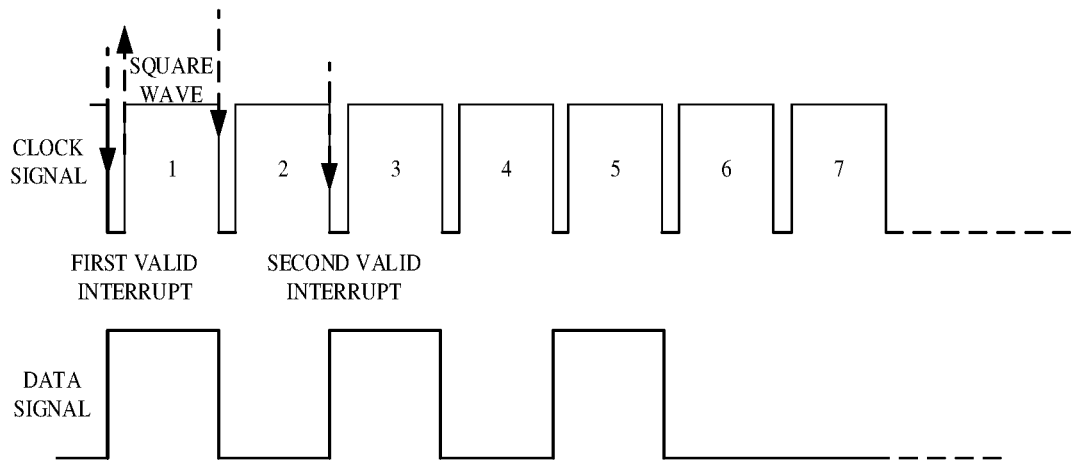
FIG. 7 is a schematic diagram of a rising edge and a falling edge of a valid interrupt according to implementations.

FIG. 7 is a schematic diagram of a rising edge and a falling edge of a valid interrupt according to implementations. As illustrated in FIG. 7, the testing system can collect a rising edge and a falling edge of the first valid interrupt, a falling edge of the square wave, and a falling edge of the second valid interrupt.

At block 104, the testing system generates a test result of the time of the instruction according to the first falling edge, the first rising edge, the second falling edge, and the third falling edge.

According to implementations, after acquiring the first falling edge and the first rising edge of the first valid interrupt, the second falling edge of the square wave, and the third falling edge of the next valid interrupt, the testing system can generate the test result of the time of the instruction according to the first falling edge, the first rising edge, the second falling edge, and the third falling edge.

In addition, according to implementations, after determining the first falling edge, the first rising edge, the second falling edge, and the third falling edge, the testing system can determine an interrupt duration of a valid interrupt according to the first falling edge and the first rising edge, a duration for transmitting data (in the following, "transmission duration" for short) according to the first falling edge and the second falling edge, and an interval according to the second falling edge and the third falling edge.

It is to be noted that, according to implementations, when the testing system generates the test result of the time of the instruction according to the first falling edge, the first rising edge, the second falling edge, and the third falling edge, the testing system can directly acquire, via the testing board, the interrupt duration, the transmission duration, and the interval. Alternatively, the testing system can first transmit, via the testing board, the first falling edge, the first rising edge, the second falling edge, and the third falling edge to the host computer and then acquire, via the host computer, the interrupt duration, the transmission duration, and the interval.

It is to be noted that, according to implementations, the test result is obtained by testing time parameters of the adaptor. According to the test result, whether the time parameters of the adaptor meet timing requirements can be determined.

In addition, according to implementations, the test result includes a first result indicative of the interrupt duration of a valid interrupt, a second result indicative of the transmission duration of instruction data, and a third result indicative of a transmission interval.

In the method for testing the time of an instruction, after being coupled with the adaptor, the testing system receives the clock signal from the adaptor, where the clock signal is indicative of the transmission time of an instruction. The testing system acquires the first valid interrupt of the clock signal, the square wave corresponding to the first valid interrupt, and the next valid interrupt of the first valid interrupt. The testing system acquires the first falling edge and the first rising edge of the first valid interrupt, the second falling edge of the square wave, and the third falling edge of the next valid interrupt. The testing system generates the test result of the time of the instruction according to the first falling edge, the first rising edge, the second falling edge, and the third falling edge. As can be seen, according to implementations, after being coupled with the adaptor, the testing system determines, according to the clock signal sent by the adaptor, rising edges and falling edges of the first valid interrupt, the square wave, and the next valid interrupt during communication, to obtain the test result of the time of the instruction of the adaptor according to rising edges and falling edges of the clock signal. As can be seen, the testing system can directly test the time of the instruction of the adaptor while communicating with the adaptor. As such, when the testing system detects the time at which the adaptor sends an instruction, the number of instructions can be decreased and the process can be simplified, thereby improving greatly efficiency and accuracy of detection.

Based on the foregoing implementations, in some implementations, the testing system generates the test result of the time of the instruction according to the first falling edge, the first rising edge, the second falling edge, and the third falling edge as follows.

The testing system determines an interrupt duration according to the first falling edge and the first rising edge.

According to implementations, after acquiring the first falling edge and the first rising edge of the first valid interrupt, the testing system determines the interrupt duration according to the first falling edge and the first rising edge.

It is to be noted that, according to implementations, the interrupt duration is indicative of how long a valid interrupt in the clock signal sent by the adaptor lasts. Therefore, the testing system can determine the interrupt duration, thereby determining whether the clock signal of the adaptor meets timing requirements.

The testing system determines a transmission duration according to the first falling edge and the second falling edge.

According to implementations, after acquiring the first falling edge of the first valid interrupt and the second falling edge of the square wave, the testing system determines the transmission duration according to the first falling edge and the second falling edge.

It is to be noted that, according to implementations, the transmission duration is indicative of time taken for data transmission when the adaptor sends the instruction. Therefore, the testing system can determine the transmission duration, thereby determining whether the time of the instruction of the adaptor meets the timing requirements.

It is to be noted that, according to implementations, the transmission duration is indicative of time taken to transmit a full byte, that is, a duration from when the testing system receives the first valid interrupt of a byte to when the testing system completes replying to a last bit of the byte.

The testing system determines an interval according to the second falling edge and the third falling edge.

According to implementations, after acquiring the second falling edge of the square wave and the third falling edge of the next valid interrupt, the testing system can determine the interval according to the second falling edge and the third falling edge.

It is to be noted that, according to implementations, the interval is indicative of an interval between transmission of different bytes when the adaptor sends the instruction. Therefore, the testing system can determine the interval, and then determine whether the time of the instruction of the adaptor meets the timing requirements.

In addition, according to implementations, the interval is indicative of a time interval between two adjacent bytes, that is, a time interval at which the adaptor consecutively sends two adjacent bytes.

The testing system determines the test result according to the interrupt duration, the transmission duration, and the interval.

According to implementations, after determining the interrupt duration, the transmission duration, and the interval, the testing system can determine the test result according to the interrupt duration, the transmission duration, and the interval.

In addition, according to implementations, the testing system can determine the test result according to the interrupt duration, the transmission duration, and the interval as follows. The testing system compares the interrupt duration with a threshold interrupt duration set in advance, compares the transmission duration with a threshold transmission duration set in advance, and compares the interval with a threshold interval set in advance, to determine the test result according to these comparisons.

In the method for testing the time of an instruction, after being coupled with the adaptor, the testing system receives the clock signal from the adaptor, where the clock signal is indicative of the transmission time of an instruction. The testing system acquires the first valid interrupt of the clock signal, the square wave corresponding to the first valid interrupt, and the next valid interrupt of the first valid interrupt. The testing system acquires the first falling edge and the first rising edge of the first valid interrupt, the second falling edge of the square wave, and the third falling edge of the next valid interrupt. The testing system generates the test result of the time of the instruction according to the first falling edge, the first rising edge, the second falling edge, and the third falling edge. As can be seen, according to implementations, after being coupled with the adaptor, the testing system determines, according to the clock signal sent by the adaptor, rising edges and falling edges of the first valid interrupt, the square wave, and the next valid interrupt in communication, to obtain the test result of the time of the instruction of the adaptor according to rising edges and falling edges of the clock signal. As can be seen, the testing system can directly test the time of the instruction of the adaptor during communication with the adaptor, which decreases the number of instructions and simplifies the process when the testing system detects the time at which the adaptor sends an instruction, thereby improving greatly efficiency and accuracy of detection.

Based on the foregoing implementations, in some implementations, before determining the test result according to the interrupt duration, the transmission duration, and the interval (that is, operations at block 104*d*), the testing system further performs the method for testing the time of an instruction as follows.

The testing system acquires a preset threshold interrupt duration, a preset threshold transmission duration, and a preset threshold interval.

According to implementations, before generating the test result according to the interrupt duration, the transmission duration, and the interval, the testing system can acquire the preset threshold interrupt duration, the preset threshold transmission duration, and the preset threshold interval.

It is to be noted that, according to implementations, the preset threshold interrupt duration, the preset threshold transmission duration, and the preset threshold interval are indicative of timing requirements of the adaptor.

In addition, according to implementations, the testing system can set in advance the preset threshold interrupt duration, the preset threshold transmission duration, and the preset threshold interval. The preset threshold interrupt duration is indicative of timing requirements on valid interrupt of the clock signal sent by the adaptor. The preset threshold transmission duration is indicative of timing requirements on data transmission performed by the adaptor. The preset threshold interval is indicative of timing requirements on time interval at which the adaptor transmits two consecutive bytes.

In some implementations, the testing system determines the test result according to the interrupt duration, the transmission duration, and the interval as follows.

The testing system obtains a first result according to the interrupt duration and the preset threshold interrupt duration.

According to implementations, after acquiring the interrupt duration and the preset threshold interrupt duration, the testing system can obtain the first result according to the interrupt duration and the preset threshold interrupt duration.

It is to be noted that, according to implementations, the testing system can compare the interrupt duration with the preset threshold interrupt duration to determine the first result according to the comparison. The first result is indicative of whether the adaptor satisfies timing requirements on valid interrupt of the clock signal.

In addition, in some implementations, after comparing the interrupt duration with the preset threshold interrupt duration, if the interrupt duration is longer than or equal to the preset threshold interrupt duration, the testing system determines that the first result is that the timing requirements are not satisfied.

Furthermore, in some implementations, after comparing the interrupt duration with the preset threshold interrupt duration, if the interrupt duration is shorter than the preset threshold interrupt duration, the testing system determines that the first result is that the timing requirements are satisfied.

The testing system obtains a second result according to the transmission duration and the preset threshold transmission duration.

According to implementations, after acquiring the transmission duration and the preset threshold transmission duration, the testing system can obtain the second result according to the transmission duration and the preset threshold transmission duration.

It is to be noted that, according to implementations, the testing system can compare the transmission duration with the preset threshold transmission duration to determine the second result according to the comparison. The second result is indicative of whether the adaptor satisfies timing requirements for sending a byte.

In addition, in some implementations, after comparing the transmission duration with the preset threshold transmission duration, if the transmission duration is longer than or equal to the preset threshold transmission duration, the testing system determines that the second result is that the timing requirements are not satisfied.

Furthermore, in some implementations, after comparing the transmission duration with the preset threshold transmission duration, if the transmission duration is shorter than the preset threshold transmission duration, the testing system determines that the second result is that the timing requirements are satisfied.

The testing system obtains a third result according to the interval and the preset threshold interval.

According to implementations, after acquiring the interval and the preset threshold interval, the testing system can obtain the third result according to the interval and the preset threshold interval.

It is to be noted that, according to implementations, the testing system can compare the interval with the preset threshold interval to determine the third result according to the comparison. The third result is indicative of whether the adaptor satisfies timing requirements on time interval at which the adaptor sends two consecutive bytes.

In addition, in some implementations, after comparing the interval with the preset threshold interval, if the interval is longer than or equal to the preset threshold interval, the testing system determines that the third result is that the timing requirements are not satisfied.

Furthermore, in some implementations, after comparing the interval with the preset threshold interval, if the interval is shorter than the preset threshold interval, the testing system determines that the third result is that the timing requirements are satisfied.

The testing system determines the test result according to the first result, the second result, and the third result.

According to implementations, after obtaining the first result, the second result, and the third result, the testing system can generate the test result of the adaptor according to the first result, the second result, and the third result.

It is to be noted that, according to implementations, the test result is indicative of whether the time parameters of the adaptor meet preset timing requirements, that is, whether the adaptor meets interrupt timing requirements of a valid interrupt, whether the adaptor meets timing requirements on time taken to send a byte, and whether the adaptor meets timing requirements on interval at which the adaptor sends two consecutive bytes.

In the method for testing the time of an instruction, after being coupled with the adaptor, the testing system receives the clock signal from the adaptor, where the clock signal is indicative of the transmission time of an instruction. The testing system acquires the first valid interrupt of the clock signal, the square wave corresponding to the first valid interrupt, and the next valid interrupt of the first valid interrupt. The testing system acquires the first falling edge and the first rising edge of the first valid interrupt, the second falling edge of the square wave, and the third falling edge of the next valid interrupt. The testing system generates the test result of the time of the instruction according to the first falling edge, the first rising edge, the second falling edge, and the third falling edge. As can be seen, according to implementations, after being coupled with the adaptor, the testing system determines, according to the clock signal sent by the adaptor, rising edges and falling edges of the first valid interrupt, the square wave, and the next valid interrupt during communication, to obtain the test result of the time of the instruction of the adaptor according to rising edges and falling edges of the clock signal. As can be seen, the testing system can directly test the time of the instruction of the adaptor while communicating with the adaptor. In this way, when the testing system detects the time at which the adaptor sends an instruction, the number of instructions can be decreased and the process can be simplified, thereby improving greatly efficiency and accuracy of detection.

Figure 8:
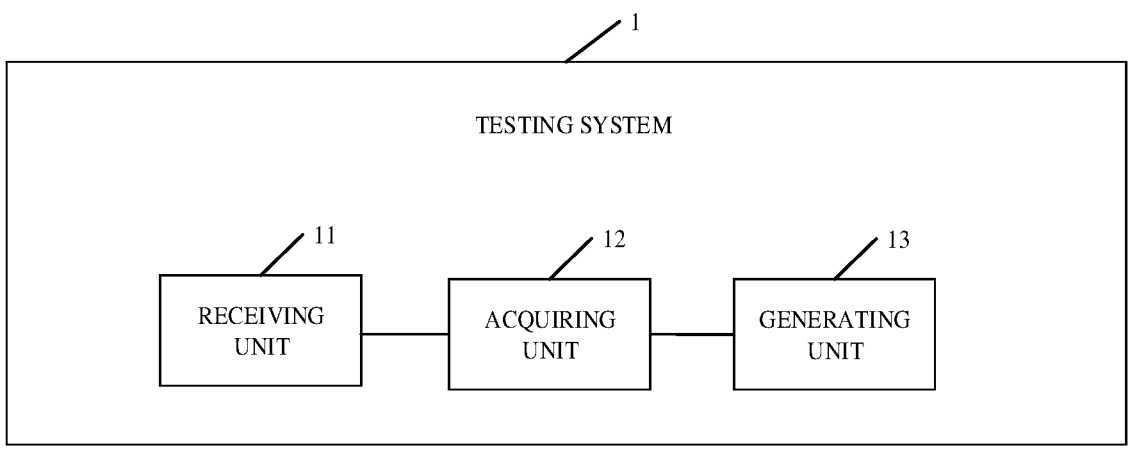
FIG. 8 is schematic structural diagram 1 of a testing system according to implementations.

Based on the foregoing implementations, FIG. 8 is schematic structural diagram 1 of a testing system according to implementations. As illustrated in FIG. 8, the testing system 1 according to implementations includes a receiving section 11, an acquiring section 12, and a generating section 13.

The receiving section 11 is configured to receive a clock signal from an adaptor after the testing system 1 is coupled with the adaptor, where the clock signal is indicative of the transmission time of an instruction. The acquiring section 12 is configured to operate as follows. The acquiring section 12 is configured to acquire a first valid interrupt of the clock signal, a square wave corresponding to the first valid interrupt, and a next valid interrupt of the first valid interrupt. The acquiring section 12 is configured to acquire a first falling edge and a first rising edge of the first valid interrupt, a second falling edge of the square wave, and a third falling edge of the next valid interrupt. The generating section 13 is configured to generate a test result of the time of the instruction according to the first falling edge, the first rising edge, the second falling edge, and the third falling edge.

In some implementations, the generating section 13 is configured to operate as follows. The generating section 13 is configured to determine an interrupt duration according to the first falling edge and the first rising edge. The generating section 13 is configured to determine a transmission duration according to the first falling edge and the second falling edge. The generating section 13 is configured to determine an interval according to the second falling edge and the third falling edge. The generating section 13 is configured to determine the test result according to the interrupt duration, the transmission duration, and the interval.

In some implementations, the acquiring section 12 is further configured to acquire a preset threshold interrupt duration, a preset threshold transmission duration, and a preset threshold interval before the generating section 13 determines the test result according to the interrupt duration, the transmission duration, and the interval, where the preset threshold interrupt duration, the preset threshold transmission duration, and the preset threshold interval are indicative of timing requirements of the adaptor.

In some implementations, the acquiring section 12 is configured to operate as follows. The acquiring section 12 is configured to obtain a first result according to the interrupt duration and the preset threshold interrupt duration. The acquiring section 12 is configured to obtain a second result according to the transmission duration and the preset threshold transmission duration. The acquiring section 12 is configured to obtain a third result according to the interval and the preset threshold interval. The generating section 13 is configured to determine the test result according to the first result, the second result, and the third result.

In some implementations, the acquiring section 12 is further configured to operate as follows. The acquiring section 12 is further configured to determine that the first result is that the timing requirements are not satisfied when the interrupt duration is longer than or equal to the preset threshold interrupt duration. The acquiring section 12 is further configured to determine that the first result is that the timing requirements are satisfied when the interrupt duration is shorter than the preset threshold interrupt duration. The acquiring section 12 is further configured to determine that the second result is that the timing requirements are not satisfied when the transmission duration is longer than or equal to the preset threshold transmission duration. The acquiring section 12 is further configured to determine that the second result is that the timing requirements are satisfied when the transmission duration is shorter than the preset threshold transmission duration. The acquiring section 12 is further configured to determine that the third result is that the timing requirements are not satisfied when the interval is longer than or equal to the preset threshold interval. The acquiring section 12 is further configured to determine that the third result is that the timing requirements are satisfied when the interval is shorter than the preset threshold interval.

Figure 9:
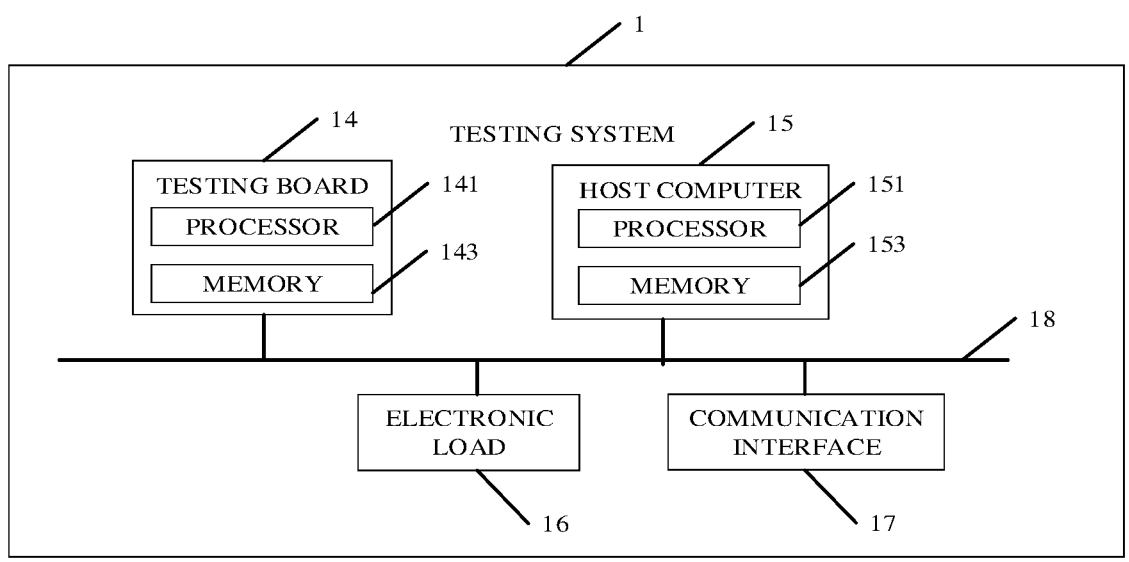
FIG. 9 is schematic structural diagram 2 of a testing system according to implementations.

FIG. 9 is schematic structural diagram 2 of a testing system according to implementations. As illustrated in FIG. 9, the testing system 1 further includes a testing board 14, a host computer 15, and an electronic load 16. The testing board 14 is integrated with a processor 141 and a memory 143 configured to store instructions operable with the processor 141. The testing system 1 further includes a communication interface 17 and a bus 18 configured to connect the testing board 14, the host computer 15, the electronic load 16, and the communication interface 17.

In some implementations, the host computer 15 is also integrated with a processor 151 and a memory 153 which have functions similar to those of the processor 141 and the memory 143 of the testing board 14.

According to implementations, the processor may be at least one of an application specific integrated circuit (ASIC), a digital signal processor (DSP), a digital signal processing device (DSPD), a programmable logic device (PLD), a field programmable gate array (FPGA), a central processing unit (CPU), a controller, a microcontroller, and a microprocessor. It can be understood that, for different apparatuses, electronic devices for implementing a function of the processor may be other devices, which is not limited herein. The testing system 1 further includes the memory configured to be coupled with the processor. The memory is configured to store executable program codes. The executable program codes include instructions operable with a computer. The memory may include a high speed random-access memory (RAM), or may further include a non-volatile memory, for example, at least two magnetic storage devices.

According to implementations, the memory is configured to store instructions and data.

In some implementations, the processor is configured to operate as follows. The processor is configured to receive a clock signal from an adaptor after being coupled with the adaptor, where the clock signal is indicative of the transmission time of an instruction. The processor is configured to acquire a first valid interrupt of the clock signal, a square wave corresponding to the first valid interrupt, and a next valid interrupt of the first valid interrupt. The processor is configured to acquire a first falling edge and a first rising edge of the first valid interrupt, a second falling edge of the square wave, and a third falling edge of the next valid interrupt. The processor is configured to generate a test result of time parameters of the adaptor according to the first falling edge, the first rising edge, the second falling edge, and the third falling edge.

In terms of generating the test result, the processor is configured to: determine an interrupt duration according to the first falling edge and the first rising edge, wherein the interrupt duration is indicative of a duration of a valid interrupt in the clock signal; and/or determine a transmission duration according to the first falling edge and the second falling edge, wherein the transmission duration is indicative of time taken for data transmission when the adapter sends an instruction to the testing system according to the clock signal; and/or determine an interval according to the second falling edge and the third falling edge, wherein the interval is indicative of an interval at which different bytes are sent when sending the instruction. The processor is further configured to determine the test result according to at least one of: the interrupt duration, the transmission duration, or the interval.

In terms of determining the test result, the processor is configured to: determine whether the time parameters of the adapter meet timing requirements on a valid interrupt in the clock signal, according to comparison between the interrupt duration and a preset threshold interrupt duration; and/or, determine whether the time parameters of the adapter meet timing requirements on transmission of one byte from the adaptor to the testing system, according to comparison between the transmission duration and a preset threshold transmission duration; and/or, determine whether the time parameters of the adapter meet timing requirements on time interval at which the adapter sends two consecutive bytes, according to comparison between the interval and the preset threshold interval.

Specifically, the processor is configured to determine that the time parameters of the adapter meet timing requirements, in response to the interrupt duration being shorter than the preset threshold interrupt duration, the transmission duration being shorter than the preset threshold transmission duration, and/or the interval being shorter than the preset threshold interval.

In practice, the memory may be one or more of a first volatile memory such as a first RAM, or a first non-volatile memory such as a first read-only memory (ROM), a first flash memory, a hard disk drive (HDD), or a solid-state drive (SSD) and is configured to provide instructions and data to the processor.

Various functional units described in implementations herein may be integrated into one processing unit or may be present as a number of physically separated units, and two or more units may be integrated into one. The integrated unit may take the form of hardware or a software functional unit.

If the integrated units are implemented as software functional units and sold or used as standalone products, they may be stored in a computer readable storage medium. Based on such an understanding, the essential technical solution, or the portion that contributes to the prior art, or all or part of the technical solution of the disclosure may be embodied as software products. The computer software products can be stored in a storage medium and may include multiple instructions that, when executed, can cause a computing device, e.g., a personal computer, a server, a network device, etc., or a processor to execute some or all operations of the methods described in various implementations. The above storage medium may include various kinds of media that can store program codes, such as a USB flash disk, a mobile hard drive, a ROM, a RAM, a magnetic disk, or an optical disk.

In the testing system provided herein, after being coupled with the adaptor, the testing system receives the clock signal from the adaptor, where the clock signal is indicative of the transmission time of an instruction. The testing system acquires the first valid interrupt of the clock signal, the square wave corresponding to the first valid interrupt, and the next valid interrupt of the first valid interrupt. The testing system acquires the first falling edge and the first rising edge of the first valid interrupt, the second falling edge of the square wave, and the third falling edge of the next valid interrupt. The testing system generates the test result of the time of the instruction according to the first falling edge, the first rising edge, the second falling edge, and the third falling edge. As can be seen, according to implementations, after being coupled with the adaptor, the testing system determines, according to the clock signal sent by the adaptor, rising edges and falling edges of the first valid interrupt, the square wave, and the next valid interrupt in communication, to obtain the test result of the time of the instruction of the adaptor according to rising edges and falling edges of the clock signal. As can be seen, the testing system can directly test the time of the instruction of the adaptor during communication with the adaptor, which is possible to decrease the number of instructions and simplify the process when the testing system detects the time at which the adaptor sends an instruction, thereby improving greatly efficiency and accuracy of detection.

Implementations provide a computer readable storage medium. The computer readable storage medium is configured to store programs which, when executed by a processor, are operable with the processor to perform the above method for testing the time of an instruction.

The program instructions for performing the method for testing the time of an instruction may be stored in a storage medium such as the optical disk, a hard disk, the USB flash disk, etc. The program instructions for performing the method stored in the storage medium, when read or executed by an electronic device, are operable with the electronic device to: receive a clock signal from an adaptor after the testing system is coupled with the adaptor, where the clock signal is indicative of the transmission time of an instruction; acquire a first valid interrupt of the clock signal, a square wave corresponding to the first valid interrupt, and a next valid interrupt of the first valid interrupt; acquire a first falling edge and a first rising edge of the first valid interrupt, a second falling edge of the square wave, and a third falling edge of the next valid interrupt; generate a test result of the time of the instruction according to the first falling edge, the first rising edge, the second falling edge, and the third falling edge.

Those skilled in the art will understand that implementations herein can provide a method, a system, or a computer program product. Therefore, the disclosure may have hardware-only implementations, software-only implementations, or software plus hardware implementations. In addition, the disclosure may be implemented in the form of a computer program product embodied on one or more computer usable storage media (including but not limited to a magnetic storage device, an optical memory, and the like) including computer usable program codes.

The disclosure is described herein with reference to schematic flowcharts and/or block diagrams of methods, apparatuses (systems), and computer program products according to the implementations of the disclosure. It should be understood that each flow and/or block in the flowchart and/or block diagram, and a combination of flow and/or block in the flowchart and/or block diagram can be implemented by computer program instructions. These computer program instructions may be provided to a general purpose computer, a special purpose computer, an embedded processor or a processor of other programmable data processing apparatuses to form a machine, such that devices for implementing functions specified by one or more flows in the flowchart and/or one or more blocks in the block diagram may be generated by executing the instructions with the processor of the computer or other programmable data processing apparatuses.

The computer program instructions may also be stored in a computer-readable memory that can direct the computer or other programmable data processing apparatuses to operate in a given manner, so that the instructions stored in the computer-readable memory produce a manufactured article including an instruction device, and the instruction device implements the functions specified by one or more flows in the flowchart and/or one or more blocks in the block diagram.

The computer program instructions may also be loaded onto the computer or other programmable data processing apparatuses, such that a series of process steps may be executed on the computer or other programmable apparatuses to produce processing implemented by the computer, so that the instructions executed on the computer or other programmable apparatuses provide steps for implementing the functions specified by one or more flows in the flowchart and/or one or more blocks in the block diagram.

The above implementations are only the example implementations of the disclosure and are however not for limiting the scope of the disclosure.

INDUSTRIAL APPLICABILITY

Implementations provide a method for testing the time of an instruction, a system for testing the time of an instruction, and a computer storage medium. After being coupled with an adaptor, the testing system receives a clock signal from the adaptor, where the clock signal is indicative of the transmission time of an instruction. The testing system acquires a first valid interrupt of the clock signal, a square wave corresponding to the first valid interrupt, and a next valid interrupt of the first valid interrupt. The testing system acquires a first falling edge and a first rising edge of the first valid interrupt, a second falling edge of the square wave, and a third falling edge of the next valid interrupt. The testing system generates a test result of the time of the instruction according to the first falling edge, the first rising edge, the second falling edge, and the third falling edge. As can be seen, according to implementations, after being coupled with the adaptor, the testing system can determine, according to the clock signal sent by the adaptor, rising edges and falling edges of the first valid interrupt, the square wave, and the next valid interrupt in communication, to obtain the test result of the time of the instruction of the adaptor according to rising edges and falling edges of the clock signal. As can be seen, while communicating with the adaptor, the testing system can directly test the time of the instruction of the adaptor, which can decrease the number of instructions and simplify the process when the testing system detects the time at which the adaptor sends an instruction, thereby improving greatly efficiency and accuracy of detection.

What is claimed is:

1. A method for testing time parameters of an adaptor, comprising:
receiving, by a testing system, a clock signal from the adaptor after the testing system is coupled with the adaptor, wherein the clock signal is indicative of communication timing between the adapter and the testing system;
acquiring, by the testing system, a first valid interrupt of the clock signal, a square wave corresponding to the first valid interrupt, and a next valid interrupt of the clock signal;
acquiring, by the testing system, a falling edge of the first valid interrupt, a first rising edge of the first valid interrupt, a falling edge of the square wave, and a falling edge of the next valid interrupt, wherein the falling edge of the square wave and the falling edge of the second valid interrupt are different; and
generating, by the testing system, a test result of time parameters of the adaptor according to the falling edge of the first valid interrupt, the first rising edge of the first valid interrupt, the falling edge of the square wave, and the falling edge of the next valid interrupt.

2. The method of claim 1, wherein generating, by the testing system, the test result of the time parameters of the adaptor according to the falling edge of the first valid interrupt, the first rising edge of the first valid interrupt, the falling edge of the square wave, and the falling edge of the next valid interrupt comprises:
determining an interrupt duration according to the falling edge of the first valid interrupt and the first rising edge of the first valid interrupt;
determining a transmission duration according to the falling edge of the first valid interrupt and the falling edge of the square wave;
determining an interval according to the falling edge of the square wave and the falling edge of the next valid interrupt; and
determining the test result according to the interrupt duration, the transmission duration, and the interval.

3. The method of claim 2, further comprising:
before determining the test result according to the interrupt duration, the transmission duration, and the interval,
acquiring a preset threshold interrupt duration, a preset threshold transmission duration, and a preset threshold interval, wherein the preset threshold interrupt duration, the preset threshold transmission duration, and the preset threshold interval are indicative of timing requirements of the adaptor.

4. The method of claim 3, wherein determining the test result according to the interrupt duration, the transmission duration, and the interval comprises:
obtaining a first result according to the interrupt duration and the preset threshold interrupt duration;
obtaining a second result according to the transmission duration and the preset threshold transmission duration;
obtaining a third result according to the interval and the preset threshold interval; and
determining the test result according to the first result, the second result, and the third result.

5. The method of claim 4, wherein obtaining the first result according to the interrupt duration and the preset threshold interrupt duration comprises:
determining that the first result is that the time parameters of the adaptor do not meet the timing requirements, in response to the interrupt duration being longer than or equal to the preset threshold interrupt duration; and
determining that the first result is that the time parameters of the adaptor meet the timing requirements, in response to the interrupt duration being shorter than the preset threshold interrupt duration.

6. The method of claim 5, wherein the timing requirements are requirements on a valid interrupt in the clock signal.

7. The method of claim 4, wherein obtaining the third result according to the interval and the preset threshold interval comprises:
determining that the third result is that the time parameters of the adaptor do not meet the timing requirements, in response to the interval being longer than or equal to the preset threshold interval; and
determining that the third result is that the time parameters of the adaptor meet the timing requirements, in response to the interval being shorter than the preset threshold interval.

8. The method of claim 7, wherein the timing requirements are requirements on time interval at which the adapter sends two consecutive bytes.

9. The method of claim 4, wherein obtaining the second result according to the transmission duration and the preset threshold transmission duration comprises:
   determining that the second result is that the time parameters of the adaptor do not meet the timing requirements, in response to the transmission duration being longer than or equal to the preset threshold transmission duration; and
   determining that the second result is that the time parameters of the adaptor meet the timing requirements, in response to the transmission duration being shorter than the preset threshold transmission duration.

10. The method of claim 9, wherein the timing requirements are requirements on transmission of one byte from the adaptor to the testing system.

11. The method of claim 2, wherein the interrupt duration is indicative of a duration of a valid interrupt in the clock signal, the transmission duration is indicative of time taken for data transmission when the adapter sends an instruction to a testing system according to the clock signal, and the interval is indicative of an interval at which different bytes are sent when sending the instruction.

12. A testing system for testing time parameters of an adaptor, comprising a testing board, a host computer, and an electronic load, and at least one of the testing board and the host computer is integrated with a processor and a memory configured to store instructions which, when executed by the processor, are operable with the processor to:
   receive a clock signal from the adaptor after the testing system is coupled with the adaptor, wherein the clock signal is indicative of communication timing between the adapter and the testing system;
   acquire a first valid interrupt of the clock signal, a square wave corresponding to the first valid interrupt, and a next valid interrupt of the clock signal;
   acquire a falling edge of the first valid interrupt, a first rising edge of the first valid interrupt, a falling edge of the square wave, and a falling edge of the next valid interrupt, wherein the falling edge of the square wave and the falling edge of the second valid interrupt are different; and
   generate a test result of time parameters of the adaptor according to the falling edge of the first valid interrupt, the first rising edge of the first valid interrupt, the falling edge of the square wave, and the falling edge of the next valid interrupt.

13. The system of claim 12, wherein the instructions operable with the processor to generate the test result are operable with the processor to:
   determine an interrupt duration according to the falling edge of the first valid interrupt and the first rising edge of the first valid interrupt, wherein the interrupt duration is indicative of a duration of a valid interrupt in the clock signal;
   determine a transmission duration according to the falling edge of the first valid interrupt and the falling edge of the square wave, wherein the transmission duration is indicative of time taken for data transmission when the adapter sends an instruction to the testing system according to the clock signal; or
   determine an interval according to the falling edge of the square wave and the falling edge of the next valid interrupt, wherein the interval is indicative of an interval at which different bytes are sent when sending the instruction; and
   determine the test result according to at least one of: the interrupt duration, the transmission duration, or the interval.

14. The system of claim 13, wherein the instructions operable with the processor to determine the test result are operable with the processor to:
   determine whether the time parameters of the adapter meet timing requirements on a valid interrupt in the clock signal, according to comparison between the interrupt duration and a preset threshold interrupt duration;
   determine whether the time parameters of the adapter meet timing requirements on transmission of one byte from the adaptor to the testing system, according to comparison between the transmission duration and a preset threshold transmission duration; or
   determine whether the time parameters of the adapter meet timing requirements on time interval at which the adapter sends two consecutive bytes, according to comparison between the interval and a preset threshold interval.

15. The system of claim 14, wherein the instructions operable with the processor to determine the test result are operable with the processor to:
   determine that the time parameters of the adapter meet timing requirements, in response to the interrupt duration being shorter than the preset threshold interrupt duration, the transmission duration being shorter than the preset threshold transmission duration, or the interval being shorter than the preset threshold interval.

* * * * *